United States Patent
Ryu et al.

(10) Patent No.: US 9,524,947 B2
(45) Date of Patent: Dec. 20, 2016

(54) MICROELECTRONIC INTERCONNECT ELEMENT WITH DECREASED CONDUCTOR SPACING

(71) Applicant: Invensas Corporation, San Jose, CA (US)

(72) Inventors: Chang Myung Ryu, Cupertino, CA (US); Kimitaka Endo, Tokyo (JP); Belgacem Haba, Saratoga, CA (US); Yoichi Kubota, Pleasanton, CA (US)

(73) Assignee: Invensas Corporation, San Jose, CA (US)

( * ) Notice: Subject to any disclaimer, the term of this patent is extended or adjusted under 35 U.S.C. 154(b) by 24 days.

(21) Appl. No.: 14/557,120

(22) Filed: Dec. 1, 2014

(65) Prior Publication Data

US 2015/0087146 A1    Mar. 26, 2015

Related U.S. Application Data

(62) Division of application No. 13/914,616, filed on Jun. 10, 2013, now Pat. No. 8,900,464, which is a division
(Continued)

(51) Int. Cl.
*H01L 23/00* (2006.01)
*H01L 21/48* (2006.01)
(Continued)

(52) U.S. Cl.
CPC ........... *H01L 24/19* (2013.01); *B81C 1/00539* (2013.01); *C25D 7/00* (2013.01); *H01L 21/4846* (2013.01);
(Continued)

(58) Field of Classification Search
CPC ...................................................... H01L 24/19
See application file for complete search history.

(56) References Cited

U.S. PATENT DOCUMENTS 5,072,075 A    12/1991  Lee et al.
5,440,805 A    8/1995   Daigle et al.
(Continued)

FOREIGN PATENT DOCUMENTS

EP    0560077 A2    9/1993
EP    0966035 A1    12/1999
(Continued)

OTHER PUBLICATIONS

Korean Office Action for Application No. KR10-2011-7003020 dated Jun. 22, 2015.
(Continued)

*Primary Examiner* — Peniel M Gumedzoe
*Assistant Examiner* — Christopher Johnson
(74) *Attorney, Agent, or Firm* — Lerner, David, Littenberg, Krumholz & Mentlik, LLP

(57) ABSTRACT

A microelectronic interconnect element can include a plurality of first metal lines and a plurality of second metal lines interleaved with the first metal lines. Each of the first and second metal lines has a surface extending within the same reference plane. The first metal lines have surfaces above the reference plane and remote therefrom and the second metal lines have surfaces below the reference plane and remote therefrom. A dielectric layer can separate a metal line of the first metal lines from an adjacent metal line of the second metal lines.

9 Claims, 11 Drawing Sheets

Related U.S. Application Data of application No. 12/459,864, filed on Jul. 8, 2009, now Pat. No. 8,461,460.

(60) Provisional application No. 61/134,457, filed on Jul. 9, 2008.

(51) Int. Cl.
    *H01L 23/498*     (2006.01)
    *B81C 1/00*     (2006.01)
    *C25D 7/00*     (2006.01)
    *H01L 21/768*     (2006.01)

(52) U.S. Cl.
    CPC .......... *H01L 21/768* (2013.01); *H01L 23/498* (2013.01); *H01L 2924/0002* (2013.01); *H01L 2924/12042* (2013.01)

(56) References Cited

U.S. PATENT DOCUMENTS

| | | | |
|---|---|---|---|
| 5,509,553 A * | 4/1996 | Hunter, Jr. | .......... H01L 21/4857 216/13 |
| 5,846,876 A | 12/1998 | Bandyopadhyay et al. | |
| 5,854,128 A | 12/1998 | Ma et al. | |
| 6,150,721 A | 11/2000 | Bandyopadhyay et al. | |
| 7,193,324 B2 | 3/2007 | Hsu | |
| 2001/0028112 A1 * | 10/2001 | Ma | .................... H01L 21/76838 257/750 |
| 2001/0032828 A1 | 10/2001 | Appelt et al. | |
| 2002/0105088 A1 | 8/2002 | Yang et al. | |
| 2004/0040739 A1 * | 3/2004 | Yoshimura | ........... H05K 1/0221 174/255 |
| 2004/0222015 A1 | 11/2004 | Ohsumi et al. | |
| 2004/0245013 A1 | 12/2004 | Chiu | |
| 2005/0082674 A1 | 4/2005 | Seta et al. | |
| 2008/0001297 A1 | 1/2008 | Lotz et al. | |
| 2008/0020132 A1 | 1/2008 | Huemoeller et al. | |

FOREIGN PATENT DOCUMENTS

| | | |
|---|---|---|
| JP | 03110849 A | 5/1991 |
| JP | H07-170069 A | 7/1995 |
| JP | 08-330473 | 12/1996 |
| JP | 2000-031280 | 1/2000 |
| JP | 2002-198422 | 7/2002 |
| JP | 2002246466 A | 8/2002 |
| JP | 3384995 B2 | 3/2003 |

OTHER PUBLICATIONS

International Search Report, PCT/US2009/004033, dated Aug. 13, 2010.

Japanese Office Acion for Application No. 2011-517428 dated Sep. 3, 2013.

* cited by examiner

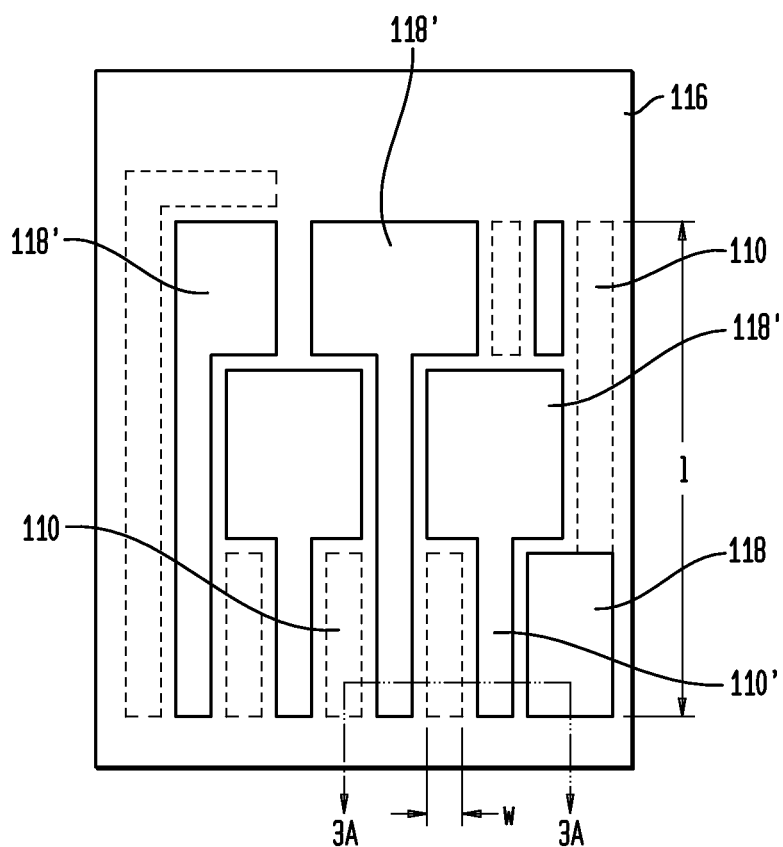

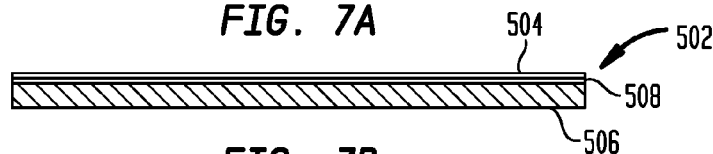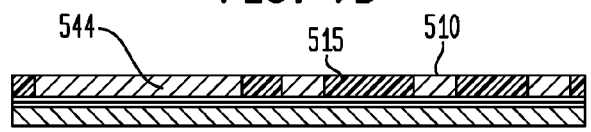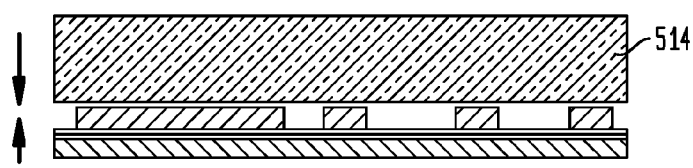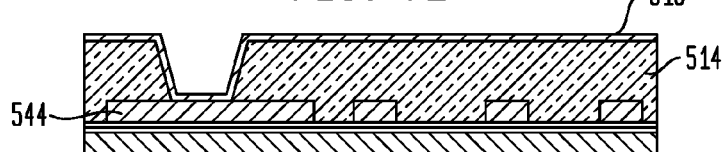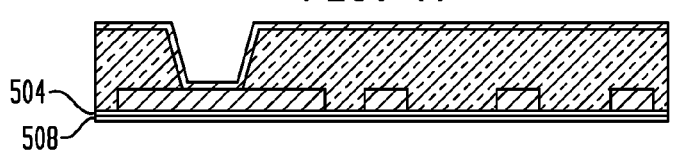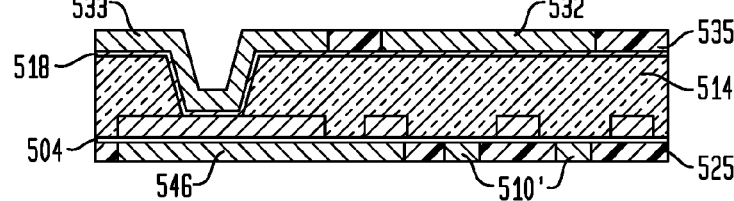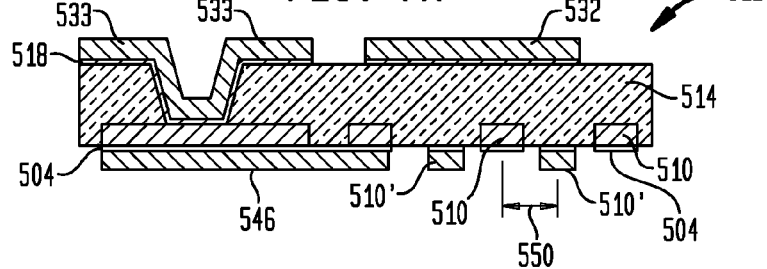

MICROELECTRONIC INTERCONNECT ELEMENT WITH DECREASED CONDUCTOR SPACING

CROSS-REFERENCE TO RELATED APPLICATIONS

The present application is a divisional of U.S. patent application Ser. No. 13/914,616, filed Jun. 10, 2013, which is a divisional of U.S. patent application Ser. No. 12/459,864, filed Jul. 8, 2009, the disclosure of which is hereby incorporated herein by reference, and claims the benefit of the filing date of U.S. Provisional Patent Application No. 61/134,457 filed Jul. 9, 2008, the disclosure of which is hereby incorporated herein by reference.

BACKGROUND OF THE INVENTION

The subject matter of the present application relates to microelectronic assemblies and fabrication methods therefor, and more particularly to the structure of and fabrication method for a multilayer interconnect element.

There is a current need for microelectronic interconnect elements to provide greater wiring density. Microelectronic interconnect elements include, for example, package substrates used for direct interconnection to microelectronic elements such as semiconductor chips. Other types of interconnect elements include circuit panels which can be directly connected to microelectronic elements or indirectly, such as through a package substrate of a packaged chip. The need is felt especially to improve the density of metal wiring lines, e.g., conductive traces on a dielectric element, as measured by the pitch of the metal lines and minimum spacing between adjacent metal lines.

Some package substrates and circuit panels have multiple dielectric layers and metal wiring lines provided on some or all of the dielectric layers. A multi-layer wiring substrate 12 according to the prior art, referred to as "High Density Interconnect" is illustrated in FIGS. 1-2. The substrate 12 has a plurality of dielectric layers, two such dielectric layers 14, and 14' being shown in FIG. 1. As shown therein, each of a plurality of metal lines 10, 10' and 10" has approximately the same width w and thickness t.

One limitation of the substrate shown in FIG. 1 is a vertical distance factor d by which each of the metal lines 10, 10' and 10" is spaced from closest adjacent metal lines (of lines 10, 10' and 10") in a vertical direction 30, i.e., the direction of the thickness of each metal line. Each of the metal lines 10 and 10' is supported by a respective dielectric layer 14 or 14'. As illustrated in FIG. 1, the metal lines 10' and 10" are separated in a vertical direction 30 of the substrate 12 by a distance d through a portion of the thickness td of the dielectric layer 14'. A minimum vertical spacing constrains the metal wiring density within the volume occupied by metal lines and dielectric layers 14 of the substrate 12. As further shown in FIG. 2, each of a plurality of traces 10" adjacent to each other in a horizontal direction 40 has width w and is spaced from the adjacent trace 10" by a spacing s. Thus, a minimum pitch of the traces 10", measured between the centers of adjacent traces, is the value of w+s. A minimum spacing s is required for manufacturability of the traces. For example, the traces 10" of FIG. 2 may be formed subtractively by etching a metal layer. In such case, a constraint in the form of a minimum spacing s is imposed by the resolution of the photolithographic exposure process used to define an etch mask, e.g., a photoresist mask, and the need for the etching process to reliably produce separated traces from a metal layer having a given thickness t. In another example, when the traces 10" of FIG. 2 are formed in an additive manner by electroplating, a minimum spacing s is imposed by the resolution of the photolithographic exposure process used to define a plating mask, e.g., a photoresist mask, the electroplating process used to form the lines, and the requirements of processes employed after the plating process, e.g., photoresist mask removal. Accordingly, in a HDI implementation, the resulting multi-layer substrate 12 has adjacent traces 10" spaced apart in a horizontal direction 40 of the substrate by a minimum spacing s. Also, a minimum distance d separates traces of adjacent dielectric layers in a vertical direction 30 of the substrate.

SUMMARY OF THE INVENTION

In accordance with an embodiment, herein, a microelectronic interconnect element can include a plurality of first metal lines and plurality of second metal lines. Each of the first and second metal lines has a surface extending within the same reference plane. The first metal lines have surfaces above the reference plane and remote therefrom and the second metal lines have surfaces below the reference plane and remote therefrom. A dielectric layer separates a metal line of the first metal lines from an adjacent metal line of the second metal lines. A pitch between the first metal line and the second metal line adjacent thereto is smaller than a pitch between adjacent ones of the first metal lines and is smaller than a pitch between adjacent ones of the second metal lines.

In accordance with an embodiment, the microelectronic interconnect element can have a plurality of first metal lines each having a lower surface whose width and length extend within a reference plane, an upper surface remote from the reference plane, and edges extending between the upper and lower surfaces. A first distance between the upper and lower surfaces of such first metal line can define a thickness of such first metal line. The microelectronic element can further include a plurality of second metal lines interleaved with the first metal lines in a direction of the width of the first metal lines. Each of the second metal lines can have an upper surface whose width and length extend within the reference plane and a lower surface remote from the reference plane. A second distance between the upper and lower surfaces of such second metal line can define a thickness of such second metal line. A dielectric layer can separate a metal line of the first metal lines from an adjacent metal line of the second metal lines. A pitch between such first metal line and the second metal line adjacent thereto can be smaller than a first pitch between adjacent ones of the first metal lines and can be smaller than a second pitch between adjacent ones of the second metal lines.

The first pitch may be equal to at least about twice a width of one of the first metal lines, and the second pitch can be equal to at least about twice a width of one of the second metal lines, such that, in a direction of the widths of the first metal lines. Thus, at least some of the first metal lines can be insulated from and spaced from at least some of the second metal lines by much less than the width of one of the first metal lines.

In a particular embodiment, at least some of the first and second metal lines can be defined by etching. In one embodiment, at least some of the first and second metal lines can be defined by plating.

In one embodiment, the widths of the first and second metal lines can be less than about 60 microns. The widths, in a particular embodiment, may be even smaller. Thus, the widths of the first and second lines may be uniform and may be at most 10 microns. The widths need not be uniform, and can be, in one embodiment, at most about 20 microns.

Each of the second metal lines may have edges that extend between the upper and lower surfaces of such second metal line. A spacing between the edge of one of the first metal lines and an adjacent edge of one of the second metal lines can be smaller than the widths of the adjacent first and second metal lines.

In one embodiment, the microelectronic interconnect element can further include a conductive pad extending in directions of the reference plane and a conductive via extending from the conductive pad through the dielectric layer. The conductive via may include a solid metal bump and the conductive pad can include a metal ring connected to at least one of the first metal lines and a conductive joining material within the metal ring. The solid metal bump can be joined to the conductive joining material. In one embodiment, the solid metal bump can be an etched metal bump. In a particular embodiment, the metal ring and the first metal lines can be formed from the same metal layer.

In accordance with another embodiment, a method is provided for forming a microelectronic interconnect element. In such method, a layered element can include first and second exposed metal layers and an etch barrier layer sandwiched between the first and second metal layers. First metal lines can be defined by a process including etching the first exposed metal layer. A dielectric layer can be formed to overlie the first metal lines. Second metal lines can be defined by a process which includes etching the second exposed metal layer.

In a particular embodiment, the etch barrier layer can be conductive and the method may further include removing a portion of the etch barrier layer between the first metal lines prior to forming the dielectric layer. A portion of the etch barrier layer can be removed between the second metal lines after forming the second metal lines.

In accordance with such embodiment, a pitch between a metal line of the first metal lines and an adjacent metal line of the second metal lines can be smaller than a first pitch between the first metal lines obtained by etching the first exposed metal layer, and can be smaller than a second pitch between the second metal lines obtained by etching the second exposed metal layer.

In accordance with another embodiment, a method is provided for forming a microelectronic interconnect element. A layered element can include a first thin exposed metal layer having a first thickness, a second exposed metal layer having a second thickness substantially greater than the first thickness, and a removable layer sandwiched between the first and second metal layers. A plurality of first metal lines can be plated onto a first surface of the first metal layer. A dielectric layer can be formed to overlie the first metal lines. The second metal layer and the removable layer can then be removed to expose a second surface of the first metal layer. A plurality of second metal lines can be plated onto the second surface of the first metal layer. The method can further include removing at least a portion of the first metal layer that is exposed between the first and second metal lines.

In accordance with a particular embodiment, a pitch between a metal line of the first metal lines and an adjacent metal line of the second metal lines can be smaller than a first pitch between the first metal lines obtained by plating and can be smaller than second pitch between the second metal lines obtained by plating.

BRIEF DESCRIPTION OF THE DRAWINGS

FIG. 3B is a plan view corresponding to FIG. 3A, further illustrating the multilayer interconnect element.

FIGS. 7A through 7H are sectional views illustrating stages in fabrication of a multilayer interconnect element in accordance with an embodiment herein.

FIG. 11C' is a plan view corresponding to the sectional view shown in FIG. 11C.

FIG. 12B' is a plan view corresponding to the sectional view shown in FIG. 12B.

DETAILED DESCRIPTION

A microelectronic interconnect element is provided in accordance with one or more embodiments of the invention. In accordance with a particular embodiment of the invention, a microelectronic interconnect element can be a package substrate having contacts for conductive connection to bond pads or other contacts of a semiconductor chip, such as, for example, a chip having microelectronic circuitry therein. The semiconductor chip can be conductively connected to the interconnect element in a face-up orientation with the contact-bearing face of the chip facing away from the interconnect element. Alternatively, the chip can be connected to the interconnect element in a face-down (flip-chip) orientation with the contact-bearing face of the chip facing the interconnect element. In another variation, a semiconductor chip could be embedded internally within the microelectronic interconnect element, such that surfaces of metal features within the interconnect element are conductively connected to contacts of the chip, with the interconnect element defining a package having terminals exposed at one or more exterior surfaces thereof. In another variation, the microelectronic interconnect element can function as a circuit panel which may be or may not be directly connected to contacts of a semiconductor chip.

Figure 3A:
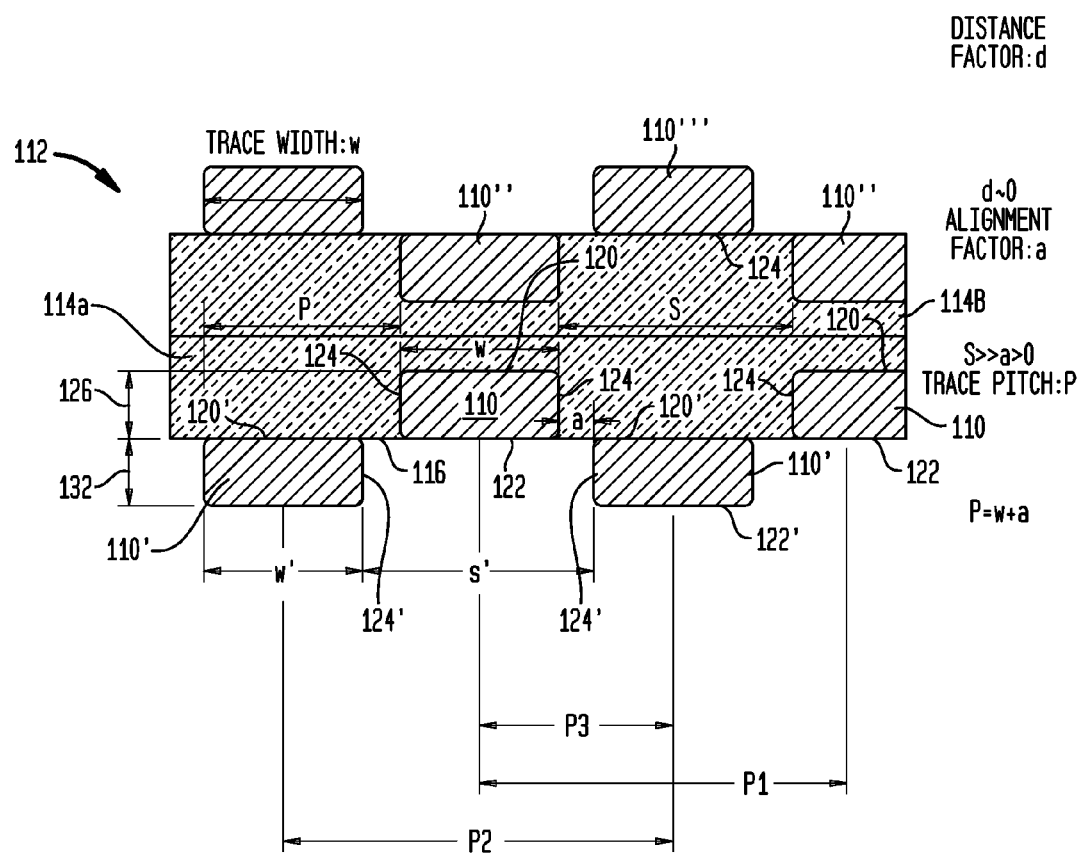
FIG. 3A is a sectional view illustrating a multilayer interconnect element in accordance with an embodiment herein.

In one embodiment, a microelectronic interconnect element is provided such as shown in FIG. 3A, in which first metal lines 110 and second metal lines 110' are supported by a first dielectric layer 114A. A second dielectric layer 114B, joined to the first dielectric layer 114A, supports third metal lines 110" and fourth metal lines 110'". FIG. 3B is a corresponding plan view looking toward the first and second metal lines 110, 110' and an exposed surface of the dielectric layer 114A. As shown in FIG. 3B, the first and second sets of metal lines can be connected to respective conductive pads 118, 118' exposed at a face of the dielectric layer 114A. The size, shape of and placement of the conductive pads on the dielectric layer 114A in FIG. 3B are merely illustrative. These can vary with the particular application of the interconnect element, and can vary with the size, shape and placement of corresponding terminals of a circuit panel to which the interconnect element is connected or is to be connected.

As seen in FIG. 3A, the vertical distance between adjacent metal layers 110, 110' is reduced essentially to zero. In contrast to the vertical separation distance d between the metal layers 10', 10" across a thickness of the dielectric layer 14' of the prior art substrate (FIGS. 1-2), in the interconnect element 112 (FIG. 3A), there no longer is a vertical separation distance across a dielectric layer 114A between adjacent metal layers 110, 110'. In the embodiment shown in the sectional view of FIG. 3A and a corresponding plan view (FIG. 3B) looking toward metal lines 110', a plurality of first metal lines 110 have lower surfaces 122 whose width w and length 1 (FIG. 3B) extend in transverse directions within a reference plane 116. The first metal lines also have upper surfaces 120 which are remote from the reference plane and edges 124 which extend between the upper and lower surfaces 120, 122. The distance 126 between the upper and lower surfaces 120, 122 of the first metal lines 110 defines a thickness 126 of the first metal lines.

A plurality of second metal lines 110' have upper surfaces whose width w' and length 1 (FIG. 3B) also extend in transverse directions within the reference plane 116. The second metal lines can also have lower surfaces 122' remote from the reference plane 116. Illustratively, a width w of the first and second metal lines can be, at minimum, from several microns to several tens of microns. In particular examples, the metal lines can have minimum width of 10 microns, or alternatively, 20 microns, or alternatively 60 microns. The widths and lengths of the first and second metal lines need not be the same.

A distance between the upper and lower surfaces 120', 122' of the second metal lines 110' defines a thickness 132 of the second metal lines. The respective thicknesses 126, 132 of the first and second metal lines can be the same or different. In one embodiment, the formation of the first and second metal lines is controlled such that their respective thicknesses 126, 132 are the same or have no more than a small percentage difference. As seen in FIGS. 3A-B, some or all of the first metal lines 110 can be interleaved with some or all of the second metal lines 110' in a direction of a width w of the first metal lines 110. A dielectric layer 114A can cover the upper surfaces 120 and edges 124 of the first metal lines. Such dielectric layer 114A may also cover at least the upper surfaces 120' of the second metal lines 110'. Although not shown in FIG. 3A, in one embodiment of the invention, dielectric layer 114A can also partially or fully cover the edges 124' of the second metal lines 110'.

Another characteristic of the microelectronic interconnect 112 is the capability of having a very small separation distance 'a' between a first metal line 110 and second metal line 110' adjacent thereto. The edges 124, 124' of adjacent ones of the first and second metal lines 110, 110' can be separated by a small distance 'a' which can be smaller than, or even much smaller than the smallest spacing "s" between adjacent edges 124 of adjacent first metal lines. Typically, the small distance 'a' is also much smaller than the spacing "s'" between the edges 124' of adjacent ones of the second metal lines. As will be apparent from the example process descriptions which follow (FIGS. 6A through 6G; or FIGS. 7A through 7H), the small distance 'a' is constrained less by the capabilities of the etching process than by photolithographic overlay tolerance. Stated another way, the distance 'a' can represent an 'alignment factor' which accounts for a misregistration tolerance in aligning a subsequently performed photolithographic patterning process with a structure resulting from a preceding independent patterning process.

Figure 1:
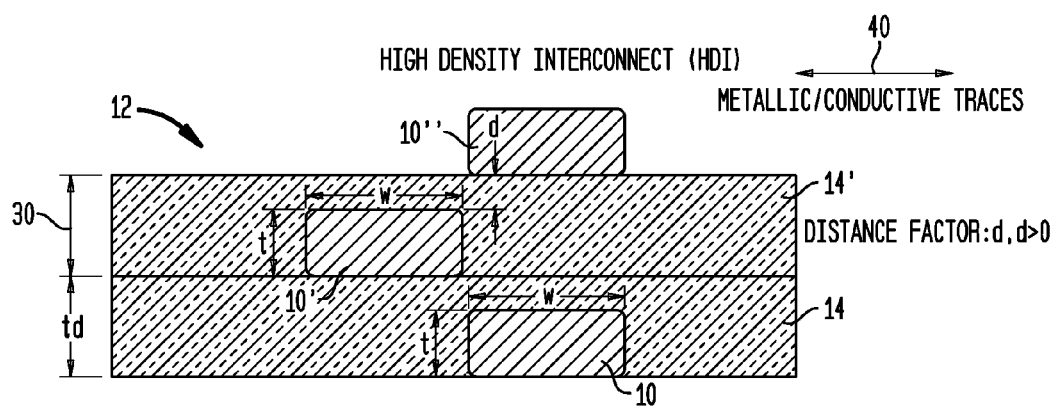
FIG. 1 is a sectional view illustrating a first multilayer interconnect element in accordance with the prior art.
Figure 2:
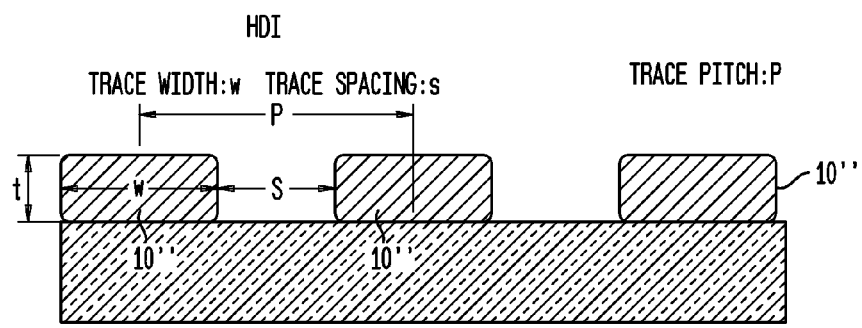
FIG. 2 is a sectional view illustrating a second interconnect element in accordance with the prior art.

As seen in FIG. 3A, the combined minimum pitch P3 of the first and second metal lines 110, 110' present on one dielectric layer 114A can be as low as the sum of the alignment factor 'a' plus half the width of each of the first and second metal lines. In fact, when the first and second metal lines 110, 110' are at the same minimum width w and are closely and uniformly spaced by a distance 'a', the combined pitch P3 of the first and second metal lines can be equal to the sum of that minimum line width w plus the alignment factor 'a'. In a particular example, the first metal lines 110 can be disposed at a first pitch P1 which is equal to at least about twice the width w of one of the first metal lines. Likewise, the second metal lines 110' can be disposed at a second pitch P2 which is equal to at least about twice the width w of one of the second metal lines. When the alignment factor 'a' is small in relation to the width of one of the first metal lines 110, it is apparent that a first metal line can be spaced from an adjacent edge of an adjacent second metal line by a distance equal to the alignment factor 'a', which is a distance much less than the width of one of the first metal lines. In one example where the first and second metal lines are interleaved as shown in FIGS. 3A-B, when the minimum width of the first metal lines is 20 microns, the minimum width of the second metal lines is 20 microns and the alignment factor is one micron, the minimum pitch of the combined first and second metal lines can be as little as 21 microns, because the adjacent first and second metal lines require a horizontal spacing between them which is only as large as the alignment factor 'a', i.e., one micron. In a particular example, it is estimated that a 50% increase in the density of metal lines supported by a single dielectric layer can be achieved in the interconnect element 112 (FIGS. 3A-B) in relation to the prior art (FIGS. 1-2).

As will be described below, the metal lines of interconnect elements can be formed subtractively by etching a metal layer (see description accompanying FIGS. 6A-H below) or semi-additively by plating the metal lines selectively onto exposed portions of a sacrificial metal layer (see description accompanying FIGS. 7A-G below).

Figure 4:
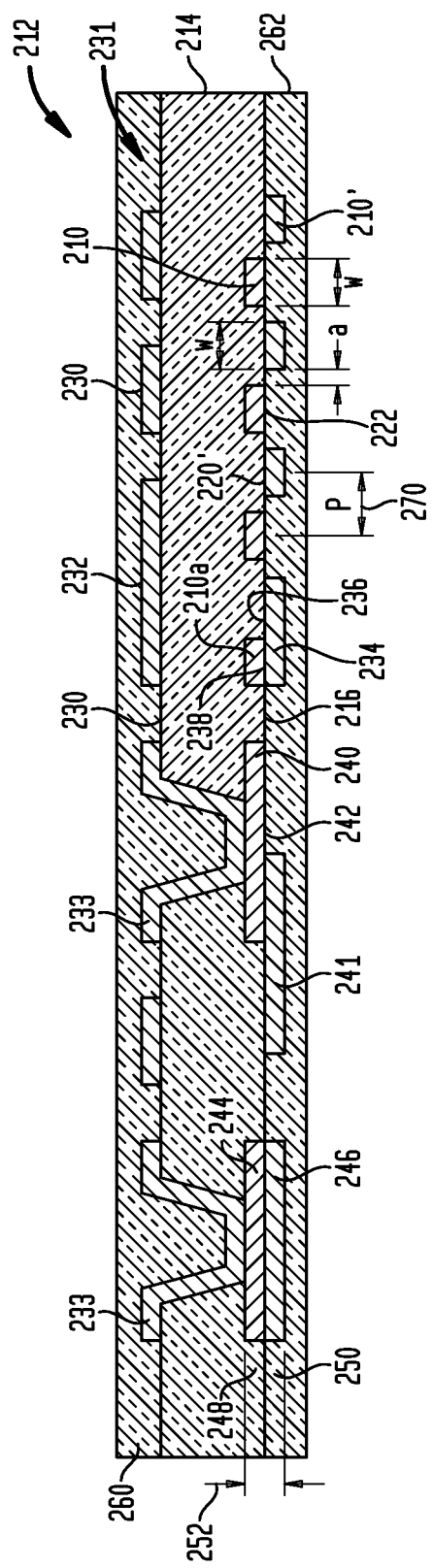
FIG. 4 is a sectional view illustrating a multilayer interconnect element in accordance with an embodiment herein.

FIG. 4 is a sectional view illustrating a microelectronic interconnect element 212 in accordance with a particular embodiment. Interconnect element 212 can be referred to as a "two-metal substrate" because metal lines 232 are present at a top surface 230 of a supporting dielectric layer 214 and first and second metal lines 210, 210' are also present at a bottom surface 216 of the dielectric layer 214. The bottom surface 216 of the dielectric layer 214 defines a reference plane such that, similar to the above-described embodiment (FIGS. 3A-B), upper surfaces 220' of the second metal lines 210' lie essentially within the reference plane. In addition, the lower surfaces 222 of the first metal lines 210 also lie within the reference plane. In one case, a conductive pad 234 at the bottom surface 216 of the dielectric layer can have a surface (at metal layer 238) that lies in the reference plane of bottom surface 216. The conductive pad 234 may overlie a first metal line 210 and have a major surface which is conductively joined to the first metal line, either directly, or through an intermediate layer 238 of metal. As further shown in FIG. 4, a conductive pad 240 can have a lower surface 242 lying in the reference plane of bottom surface 216, such pad 240 being conductively connected to a major surface of an adjacent metal feature 241 (metal line or conductive pad). In one example, the adjacent surfaces of conductive pads 244, 246 can be actually or essentially co-extensive in dimensions within the reference plane 216 such that conductive pads 244, 246 form a thicker conductive pad having a thickness 252 equal to at least the combined thicknesses 248, 250 of the respective individual conductive pads 244, 246.

In an interconnect element of the type sometimes referred to as a "two-metal substrate" 212, a metal layer 231 is formed on the top surface 230 of the dielectric layer 214 and in exposed holes of the dielectric layer 214. The metal layer 231 includes hollow conductive via liners which conductively join conductive pads 240, 244 along the reference plane 216 at the bottom of the substrate 212 with metal features, e.g., metal lines 232, at the top surface 230. Protective dielectric coatings 260, 262, such as provided as a photo-imageable polymer layer, e.g., a solder mask or other dielectric coating or layer, may cover exposed surfaces of the first and second metal lines 210, 210' and the metal layer 231. Although not shown in FIG. 4, the protective dielectric coatings 260, 262 can have openings aligned with conductive pads or other features of the substrate 212 to provide access for interconnecting the conductive pads or other features with terminals of other microelectronic elements. Illustratively, in the embodiment depicted in FIG. 4, each of the first and second metal lines 210, 210' can have a minimum width of 20 microns. In one example, a spacing between edges of adjacent ones of the first and second metal lines can be 20 microns. Then, a pitch of the first and second metal lines in a direction of a width of the first metal lines 110 is 40 microns. By the principles described in the foregoing (FIGS. 3A-B), the spacing between adjacent edges of the first and second metal lines can be reduced to a value equal to an alignment factor 'a' which accounts for photolithographic overlay tolerance. Thus, adjacent first and second metal lines 210, 210' can have a substantially smaller pitch. Alignment factors as small as 0.5 microns are believed achievable, and even smaller alignment factors may be achievable under appropriately controlled conditions. Therefore, the minimum pitch 270 of first and second metal lines 210, 210' can be as little as the sum of the half width of each metal line, plus a minimum value of the alignment factor (e.g., 0.5 micron), such that the minimum pitch can be ½(20)+½(20)+0.5 microns=20.5 microns.

Figure 5:
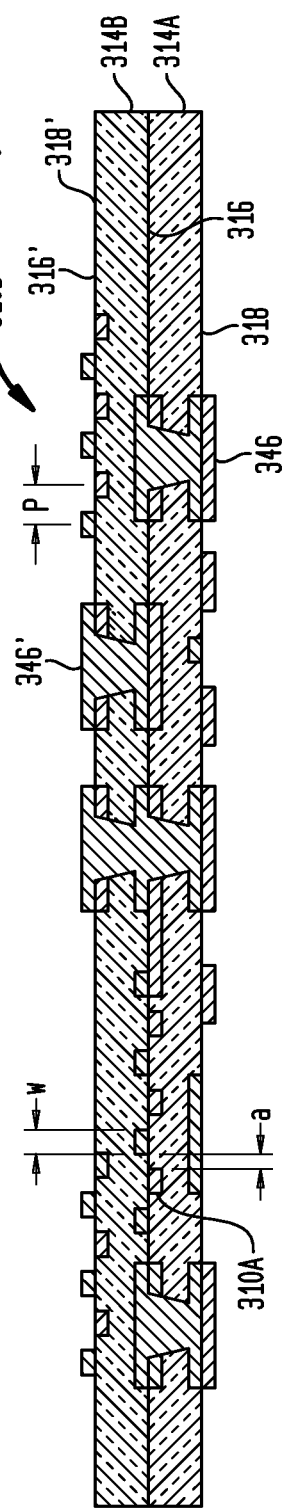
FIG. 5 is a sectional view illustrating a multilayer interconnect element in accordance with an embodiment herein.

FIG. 5 illustrates a microelectronic interconnect element 312 similar to that shown in FIGS. 3A-B, in which each of two supporting dielectric layers 314A, 314B has an interleaved set 310A of first and second metal lines such as described above and another interleaved set 310B of first and second metal lines. Each set 310A, 310B is disposed at respective reference planes 316, 316' of the interconnect element 312. Solid metal posts or bumps connect conductive pads disposed at reference plane 316 to metal features such as conductive pads 346, 346' and metal lines at exposed surfaces 318 and 318' of the respective dielectric layers 314A, 314B.

Figure 6A:
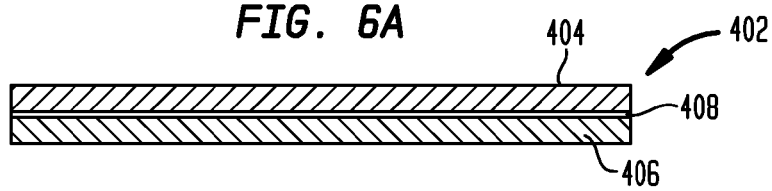
FIGS. 6A through 6G are sectional views illustrating stages in fabrication of a multilayer interconnect element in accordance with an embodiment herein.

FIGS. 6A-G are sectional views illustrating a process for forming a microelectronic interconnect element 412 (FIG. 6G) similar to that shown and described above with reference to FIG. 4. As seen in FIG. 6A, in a preliminary stage of fabrication, a layered metal structure 402 is shown. The layered metal structure includes a first metal layer 404 and a second metal layer 406, each of which will be patterned by etching to form first metal lines and second metal lines, respectively. Each of the first and second metal layers 404, 406 has a thickness which, illustratively, can be several microns or can be several tens of microns or more. In a particular embodiment, the thicknesses of each metal layer 404, 406 ranges between about 5 microns and about 18 microns. The first and second metal layers may consist essentially of the same metal, for example, copper. Sandwiched between the first and second metal layers 404, 406 is an etch barrier layer 408, which can be a metal layer which is not attacked by an etchant which attacks the first and second metal layers. The etch barrier layer 408 need not be very thick, in accordance with the degree of selectivity of an etch process used to pattern the first and second metal layers. In one embodiment, the etch barrier layer can be a metal such as nickel which exhibits good selectivity in etch processes relative to copper. In other embodiments, the etch barrier can be at least one metal selected from the group consisting of aluminum, nickel, silver, gold, palladium, lead and tin (AL, Ni, Ag, Au, Pd, Pb, Sn).

Figure 6B:
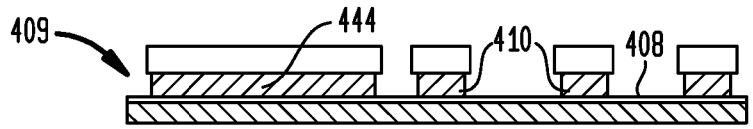

Thereafter, as seen in FIG. 6B, a photoresist mask 409 is formed by depositing and photolithographically patterning a photoresist layer. The photoresist mask overlies only portions of the first metal layer, while exposing other portions of the first metal layer. The photolithographic exposure can be formed using a contact mask or by casting an image of a photomask onto the photoresist layer. In the latter case, a stepper may be used to move between individual portions of a large size metal structure 402, which, after most fabrication steps, will be severed into individual microelectronic interconnect elements.

Figure 6C:
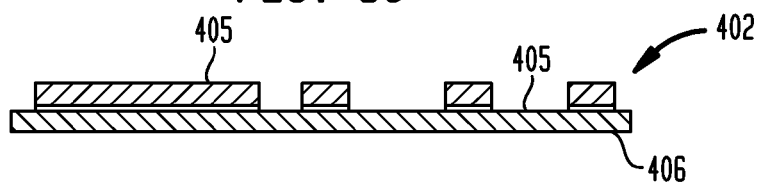

An etch process then is applied which etches the exposed portions of metal layer 404 selectively with respect to the etch barrier layer 408 to define first metal lines 410 and first conductive pads 444 of the illustrated structure. (FIG. 6B). For example, when the metal layer 404 is a copper layer, an alkali-based etchant can be used to define the metal lines. Next, as shown in FIG. 6C, the photoresist mask 409 and exposed portions of the etch barrier 408 are removed from the etched metal structure 402. In one example, the etch barrier 408 can be removed by etching selectively with respect to the underlying metal layer 406. The exposed surfaces 405 of the metal lines 410 and the underlying metal layer 406 then can be roughened to promote adhesion, such as through a flash wet etch process typically lasting only a short time, such as one minute.

Figure 6D:
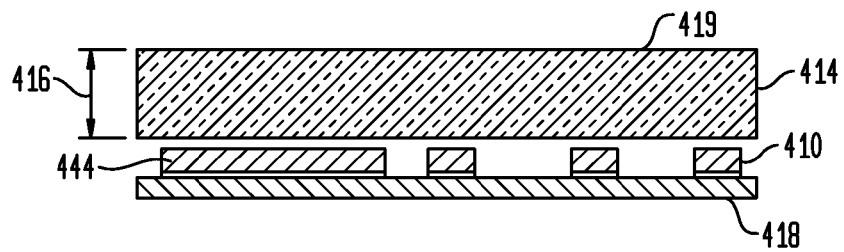

As shown in FIG. 6D, a dielectric layer 414 is formed to cover the exposed surfaces of the metal lines 410 and the conductive pad 444. The dielectric layer can be rigid, semi-rigid, or flexible, depending upon the thickness 416 and the Young's modulus (elastic modulus) of the dielectric material. In one example, the dielectric layer is a pre-preg type, uncured or partially cured layer having a glass fiber-epoxy construction. Alternatively, the dielectric layer can be an ABF composite (organic silica-filled resin) or polyimide-based dielectric material. Such dielectric layer can be laminated to the etched metal structure 402 by thermo-compression bonding. For example, an uncured or partially cured glass-fiber epoxy resin dielectric layer can be laminated to the etched metal structure by applying pressure to exterior surfaces 418, 419 of the metal structure 402 and dielectric layer 414 of about 10 kg per cm$^2$ and gradually increasing a temperature thereof to about 160° C. and maintaining such pressure and temperature for a period of time. In a particular example, the thermo-compression bonding process can take two to three hours to perform.

In other variations, the dielectric layer 414 could be formed by spin-coating, roller-coating, screen-printing, stenciling or dispensing of a dielectric material, following by appropriate post-processing such as curing, which may or may not include baking.

Figure 6E:
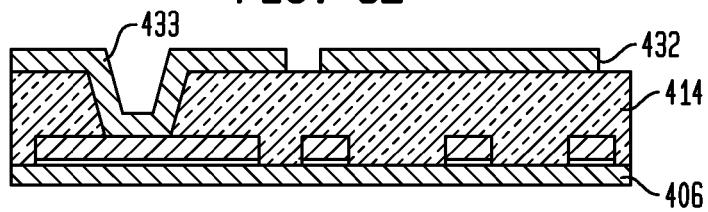

Next, as illustrated in FIG. 6E, steps are performed to form a conductive via 433 and additional metal lines 432. A hole is formed in the dielectric layer 414, such as by laser drilling, mechanical drilling, etching or any other suitable method, after which the conductive via 433 and metal lines 432 are plated thereon. In one example, the plating can be performed by electrolessly depositing a conductive seed layer (not shown), typically having a thickness of less than one micron, then depositing and patterning a photoresist mask to cover portions of the seed layer, and then forming the metal lines 432 and conductive via 433 on the seed layer by electroplating. Thereafter, the photoresist mask is removed and exposed portions of the conductive seed layer are removed such as by applying an etchant. In one example, the seed layer consists of copper or consists essentially of copper and the metal lines 432 and conductive via 433 can consist essentially of copper. Then, the process used to remove the seed layer can also help clean exposed surfaces of the metal lines 432 and via 433.

Figure 6F:
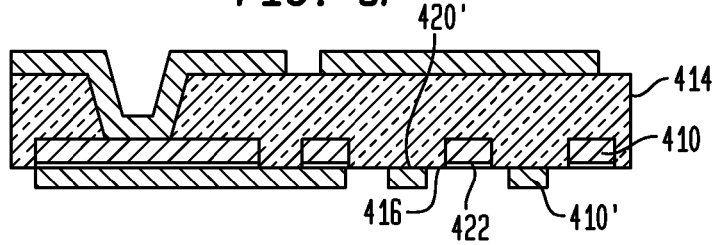

Next, metal layer 406 is patterned to form second metal lines 410' interleaved with the first metal lines 410, as shown in FIG. 6F. In such way, the lower surfaces 422 of the first metal lines and the upper surfaces 420' of the second metal lines have width and length in directions of the same reference plane 416, such reference plane 416 being defined generally by the interface between metal layers 404, 406 (FIG. 6A). The second metal lines 410' can be formed by patterning metal layer 406 in a process similar to the patterning of the metal layer 404 (FIG. 6B) to form lines 410. A photoresist mask can be formed and then the metal layer 406 be etched selectively with respect to the material of the dielectric layer 414 and the etch barrier 408. Conductive pads 446 may be formed from the metal layer 406. In one example, the conductive pads can be partially or fully aligned with the conductive pads 444 formed from metal layer 404. Because the first metal lines 410 and the second metal lines 410' are formed by separate etching processes, the pitch P, 450 (FIG. 6G) between a first metal line and an adjacent second metal line can be the sum of half the width of each metal line plus an alignment factor 'a'. In a particular embodiment, the pitch 450 between a first meal line and a second metal line adjacent thereto can be smaller than a minimum pitch between first metal lines that can be achieved when patterning the first metal lines 410 in accordance with the etching process. Likewise, the pitch 450 can be smaller than the pitch between second meal lines 410' that can be achieved when patterning those metal lines 410'.

Figure 6G:
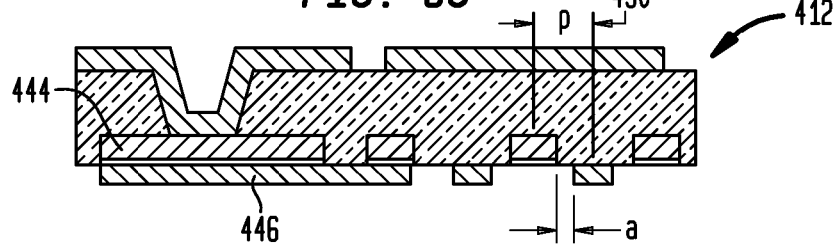

Subsequently, as illustrated in FIG. 6G, portions of the etch barrier 408 (FIG. 6A) which are exposed after such etch process can then be removed, such as by a short duration flash wet etch as described above (FIG. 6C), to form the microelectronic interconnect element as shown.

FIGS. 7A through 7H are sectional views illustrating stages in a process of forming a microelectronic interconnect element 512 (FIG. 7H) in accordance with another embodiment of the invention. The steps used to form the microelectronic interconnect element 512 are the same as those used to form microelectronic interconnect element 412 (FIG. 6G), with exceptions as noted below. In a preliminary stage of fabrication (FIG. 7A), a layered metal structure 502 is provided which is similar to the structure 402 used in the above process (FIGS. 6A-G), except that an upper metal layer 504 can be rather thin, for example, having a thickness between about one micron and three microns. On the other hand, the lower layer 506 of the structure 502 can be a carrier layer provided for mechanical support, and hence can be relatively thick, such as having thickness of about 35 microns. In a particular embodiment, the metal layers 504, 506 can consist essentially of copper or copper alloys and the etch barrier 508 can consist essentially of nickel.

Subsequently, as shown in FIG. 7B, a photoresist mask 515 is formed to cover portions of the metal layer 504. First metal lines 510 and a conductive pad 544 then are formed on exposed portions of the metal layer 504 by electroplating. Electroplated metal lines may be formed with straighter, i.e., more vertical, edges than the edges of metal lines 410, 410' (FIG. 6F) which are formed by etching. In some cases, it may be advantageous to form metal lines by electroplating rather than by etching, for applications which require the highest performance.

Thereafter, the photoresist mask 515 is stripped from the metal structure 502 (FIG. 7C), after which the dielectric layer 514 is formed (FIG. 7D) by processes such as described above with reference to FIG. 6D.

Next, a hole can be formed in the dielectric layer 514 in alignment with the conductive pad 544, after which a conductive seed layer 518 can be deposited on exposed surfaces of the dielectric layer 514, such as by electroless plating. The lower metal layer 506 can be removed, leaving the structure as shown in FIG. 7F. The lower metal layer can be removed, for example, by etching selectively with respect to the etch barrier 508 (FIG. 7A). The etch barrier can then be removed by a further etch process performed selectively with respect to the metal layer 504.

Thereafter, as illustrated in FIG. 7G, second metal lines 510' and a conductive pad 546 can be formed, such as by electroplating onto portions of the metal layer 504 which are exposed by a photoresist mask 525 formed thereon. For example, the second metal lines 510' and pad 546 can be formed by electroplating copper onto the metal layer 504. In the same step, or in different steps, metal lines 532 and a conductive via 533 can be formed by electroplating to overlie portions of an opposite-facing surface of the dielectric layer 514 exposed by another photoresist mask 535. Such lines 532 and via 533 can be formed by electroplating copper, for example.

Similar to the above fabrication method (FIGS. 6A-G), pitch 550 that can be achieved between a first metal line 510 and an adjacent second metal line 510' can be smaller than the minimum pitch that can be achieved between adjacent first metal lines 510 or between adjacent second metal lines 510' using the plating processes provided therefore.

In the stage of fabrication illustrated in FIG. 7H, the photoresist masks 525, 535 are removed and portions of the metal layer 504 which are exposed between metal lines 510, 510' and the conductive pad 546 are removed, such as by a controlled timed etch process. The same or a similar process can be used to remove portions of the conductive seed layer 518 (FIG. 7E) exposed between the metal line 532 and via 533.

In a variation of the above-described process (FIGS. 7A-H), the metal structure 502 can include a removable peelable adhesive instead of an etch barrier 508. The peelable adhesive would be designed to releasably attach the metal layers, such that the lower metal layer 506 can be removed at the step shown in FIG. 7F by peeling instead of requiring etching. Such peelable adhesive would also be fully removable, e.g., by peeling with the carrier metal layer 506, or by being soluble in water or other solvent, such that the major surface of the metal layer 504 is fully exposed after its removal.

Figure 8:
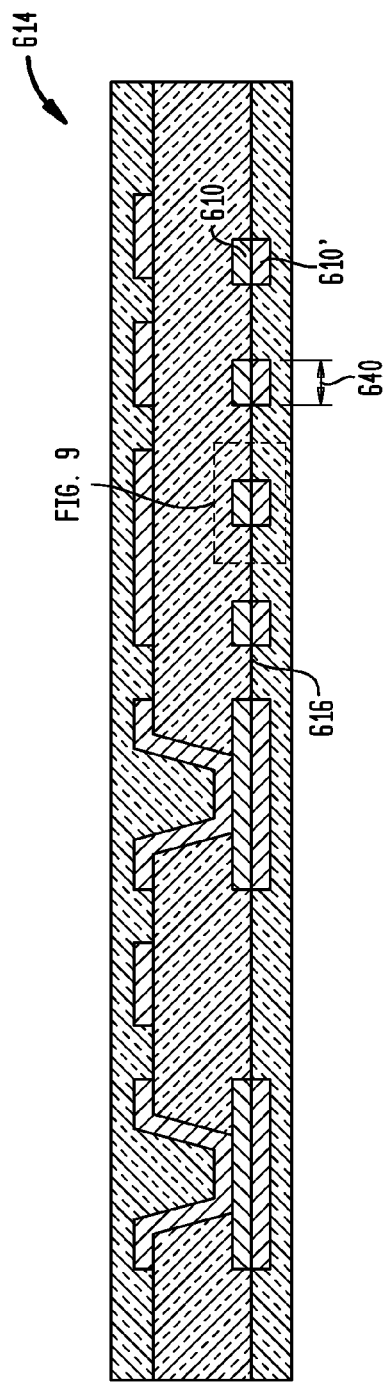
FIG. 8 is a sectional view illustrating a multilayer interconnect element in accordance with an embodiment herein.

FIG. 8 is a sectional view illustrating a microelectronic interconnect element 614 in accordance with a variation of the above-described embodiment (FIGS. 3A-B, 4). In this embodiment, the first and second metal lines 610, 610', having respective surfaces within the reference plane 616, are aligned with each other in a direction of the width 640 of each line. In such case, a pair of aligned first and second metal lines 610, 610' can form a single conductor, such as for conducting a signal from one location to another on the interconnect element 614. In one embodiment, single conductors formed by the aligned metal lines 610, 610' can be fabricated using the above-described processes (FIGS. 6A-G; 7A-H), simply by using appropriate photoresist masks in which the metal lines become aligned.

Figure 9:
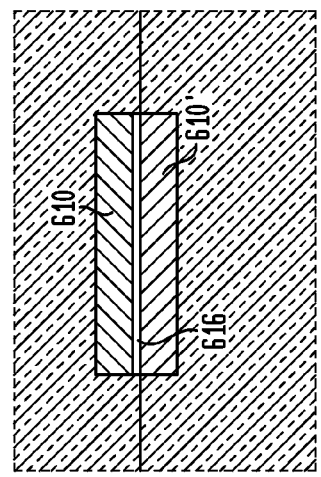
FIG. 9 is a fragmentary sectional view further illustrating the multilayer interconnect element shown in FIG. 8.

The partial enlarged sectional view of FIG. 9 illustrates a three-layer metal structure which can be present within the pair of aligned metal lines, when formed such as by the above-described methods (FIGS. 6A-G; or FIGS. 7A-H). When the metal layers from which lines 610, 610' are formed are relatively thin, such as, illustratively, 12 microns, the single thicker conductors formed by aligned metal lines 610, 610' can provide improved signal conduction. This can be particularly important for conducting signals having frequencies above one (1) gigahertz (GHz), where the skin effect and the shape of signal conductors begin to have more significant affects.

The microelectronic element 614 need not have only first and second metal lines aligned in the manner shown in FIG. 8. Very tight-pitched metal lines formed by interleaved sets of first and second metal lines 110, 110', such as those shown and described above (FIGS. 3A-B; 4-5) can also be formed simultaneously with the aligned metal lines. Such results can be achieved by processing such as described above (FIGS. 6A-G; 7A-H) and by forming appropriate photoresist masks in which the first and second metal lines are interleaved in some places and aligned in other places.

Figure 10:
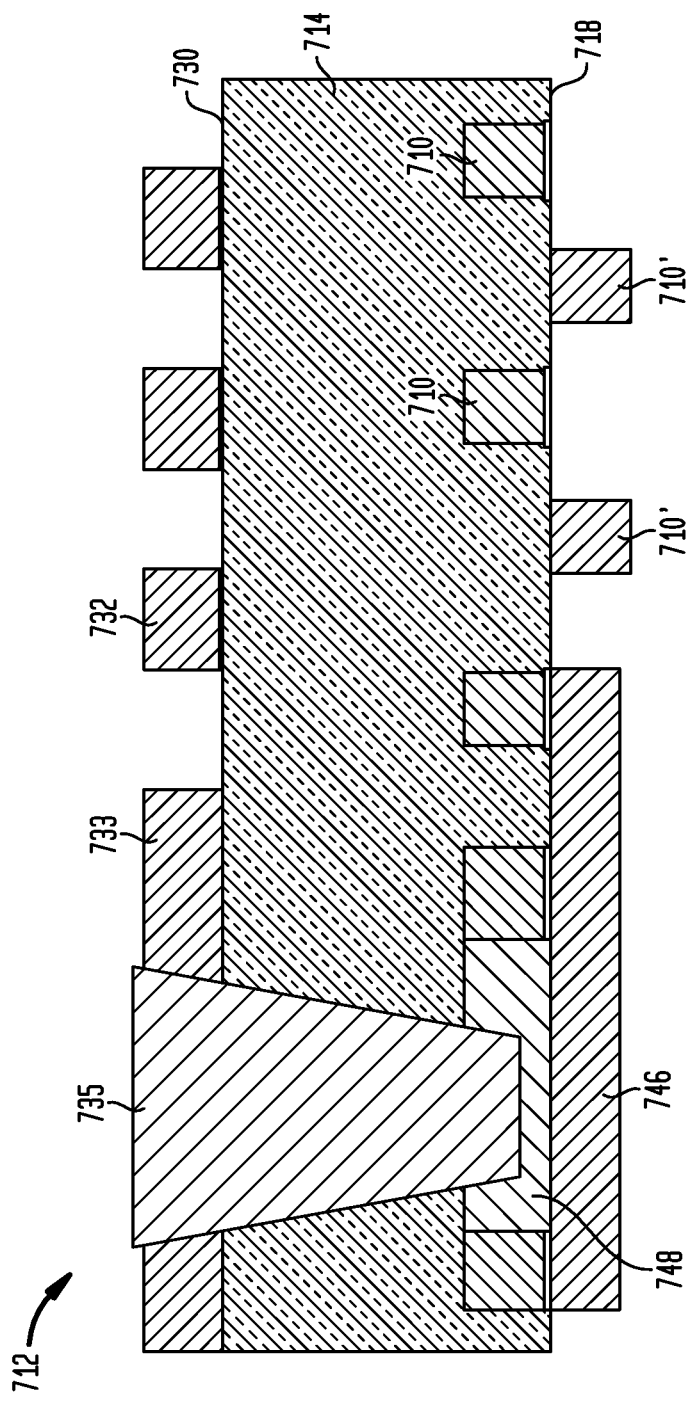
FIG. 10 is a sectional view illustrating a multilayer interconnect element in accordance with an embodiment herein.

FIG. 10 is a sectional view illustrating a microelectronic interconnect element 712 in accordance with another embodiment of the invention in which a solid metal bump or post 735, rather than a conductively lined hole, is used to conductively interconnect a conductive pad 733 at one face 730 of a dielectric layer 714 with another conductive pad 746 at another face 718 of the dielectric layer. The solid metal post may be connected to the metal lines 732, and the pad 733 may be connected to metal lines 710, 710'. In that case, the metal post can conductively connect the metal lines 732 at the top face 730 of the dielectric layer with the interleaved metal lines 710, 710' at the bottom face 718. Solid metal bumps or posts, for example, solid copper posts, tend to have superior thermal conductivity compared to hollow conductive vias, i.e., vias formed by a metal lining on an inner surface of a hole in a dielectric layer.

As illustrated in FIG. 10, the solid metal post 735 can be mechanically and conductively joined to the conductive pad 746 through a conductive joining material 748 which is different from the metal of the conductive pad 746. The conductive joining material can be a relatively low-melting point metal or metal alloy such as, for example, tin, indium, having a melting temperature of less than 250° C., or alternatively, a conductive paste such as a metal-filled paste, e.g., silver-filled or solder-filled paste, for example. The conductive joining material can assist in the formation of a mechanically and conductively sound joint between the post 735 and the conductive pad 746 at lower temperatures and pressures than may be needed to directly join a metal post 735 of copper with a conductive pad 746 of copper, for example.

Figure 11A:
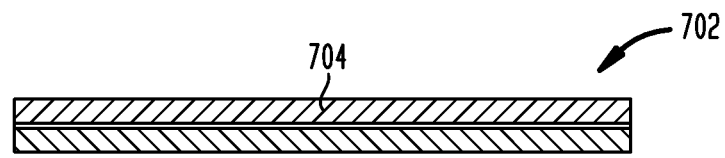
FIGS. 11A-11C are sectional views illustrating stages in a method of fabricating a multilayer interconnect element in accordance with an embodiment herein.
Figure 11B:
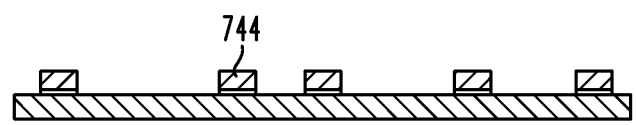
Figure 11C:
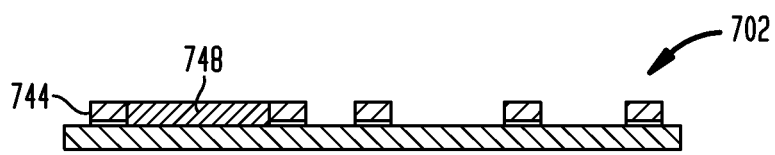
Figure 11C:
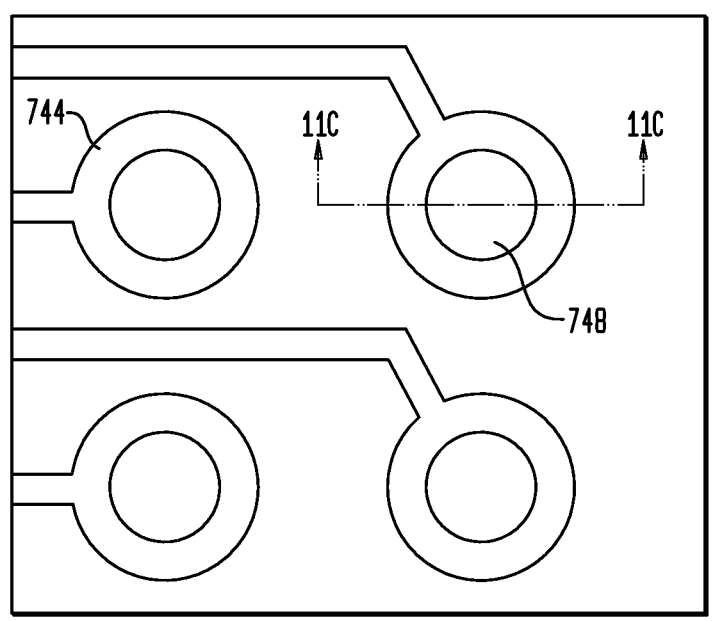

FIGS. 11A-C are sectional views and FIG. 11C' is a plan view corresponding to FIG. 11C though line 11C-11C, which illustrate stages in processing of a metal structure 702 of the interconnect element 714. The steps performed with respect to FIGS. 11A-B are the same as those of the above-described process (FIGS. 6A-B), except that a metal ring 744 (FIG. 7B; 7C') is formed from the metal layer 704 in place of a planar conductive pad. Then, as illustrated in FIGS. 11C and 11C', the metal ring is filled with the conductive joining material 748. A variety of techniques can be used to fill the ring with conductive paste, such as screen printing, stenciling, dispensing, or placing a conductive ball containing the low-melting temperature metal into the ring and reflowing the metal structure with the conductive ball in the metal ring 744 of the structure 702.

Figure 12A:
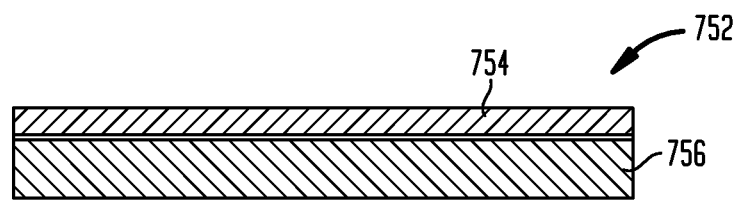
FIGS. 12A-12B are sectional views illustrating stages in a method of fabricating a multilayer interconnect element in accordance with an embodiment of the invention.
Figure 12B:
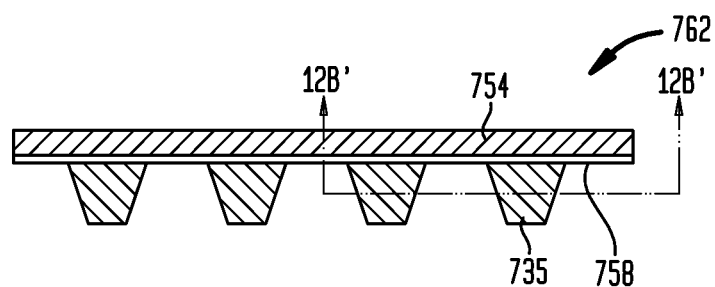
Figure 12B:
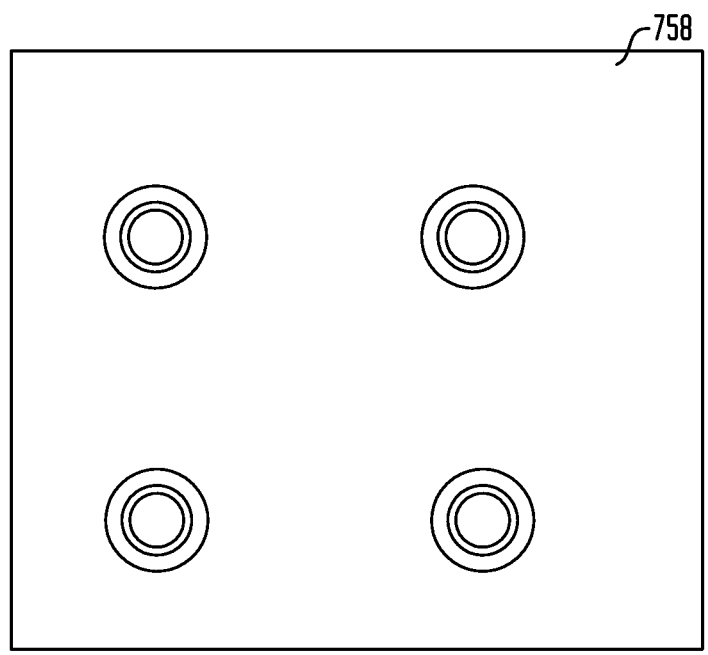

FIGS. 12A-B are sectional views and FIG. 12B' is a plan view corresponding to FIG. 12B through line 12B-12B, which illustrate stages in forming an etched metal structure 762 having a metal carrier layer 754 (FIG. 12B) with solid metal bumps 735 thereon. As illustrated in FIG. 12A, a layered metal structure 752, similar to the structure (402) described above (FIG. 6A), but which may include a thicker metal layer 756, e.g., a copper layer having a thickness of about 50 microns, is patterned by etching in accordance with a photoresist mask (not shown) to form the solid metal posts 735 (FIG. 12B). In forming the posts, the metal layer 756 is fully etched to the level of the underlying etch barrier 758. In one embodiment, the etch barrier 758 can be nickel. Illustratively, one or more metals could be used as the etch barrier, such as one or more of Al, Ni, Ag, Au, Pd, Pb or Sn.

Figure 13A:
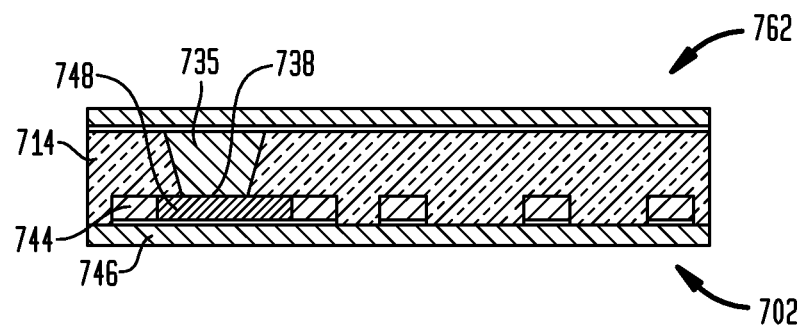
FIGS. 13A-13C are sectional views illustrating stages in a method of fabricating a multilayer interconnect element in accordance with an embodiment of the invention.
Figure 13B:
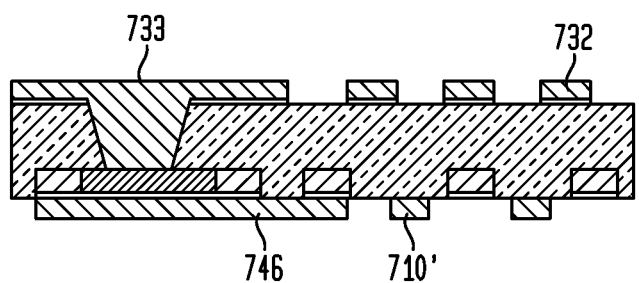
Figure 13C:
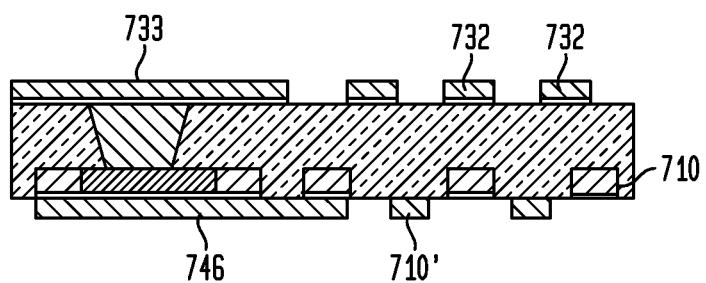

Thereafter, as illustrated in FIGS. 13A-C, the etched metal structure 762 is joined to the etched metal structure 702 with a dielectric layer 714 between the two metal structures. Illustratively, the dielectric layer can be 50 microns, but may be thinner or thicker in accordance with functional and form-factor requirements. The dielectric layer 714 and its fabrication can be such as described above with respect to FIG. 6D.

During the joining process, the tip 738 of the solid metal post may bear against the joining material 748 and cause it to deform somewhat. The combination of the metal ring 744 of the lower metal structure 702 and the tapered profile of the etched solid metal posts can assist in the self-alignment of the metal posts 735 with the interiors of the metal rings 744. In that way, it may be possible to loosen somewhat the tolerances for optically aligning the metal structures 702, 762 with each other.

A thermocompression bonding process may be used to join the metal structures with the dielectric layer, such as described above with reference to FIG. 6D. Baking the structure at a moderately elevated temperature such as at a temperature, for example, of about 150° C. to about 250° C.

can be done to form a mechanically and conductively sound joint between the post 735 and the conductive pad 746 through the joining material 748.

Thereafter, the exposed metal layer of the structure is patterned to define metal lines 732 and conductive pad 733 (FIG. 13B) and the exposed metal layer of the structure 702 is patterned to define metal lines 710' and conductive pad 746 in a manner such as described above (FIGS. 6E-F). Thereafter, as illustrated in FIG. 13C, portions of the etch barrier layers which are exposed between respective metal lines 732 and the pad 733 and between respective metal lines 710, 710' and the pad 746 can be removed, such as by a selective etch process.

While the above description makes reference to illustrative embodiments for particular applications, it should be understood that the claimed invention is not limited thereto. Those having ordinary skill in the art and access to the teachings provided herein will recognize additional modifications, applications, and embodiments within the scope of the appended claims.

The invention claimed is:

1. A method of forming a microelectronic interconnect element, comprising:
   (a) given a layered element including a first thin exposed metal layer having a first thickness, a second exposed metal layer having a second thickness substantially greater than the first thickness, and a removable layer sandwiched between the first thin exposed metal layer and second exposed metal layers, plating a plurality of first metal lines onto a first surface of the first thin exposed metal layer;
   (b) forming a dielectric layer overlying the plurality of first metal lines;
   (c) removing at least the second exposed metal layer and the removable layer to expose a second surface of the first thin exposed metal layer;
   (d) plating a plurality of second metal lines onto the second surface of the first thin exposed metal layer; and
   (e) removing at least a portion of the first thin exposed metal layer exposed between the plurality of first metal lines and plurality of second metal lines.

2. The method of forming the microelectronic interconnect element as claimed in claim 1, wherein a pitch between a metal line of the plurality of first metal lines and an adjacent metal line of the plurality of second metal lines is smaller than a first pitch between the plurality of first metal lines obtained by plating and is smaller than a second pitch between the plurality of second metal lines obtained by plating.

3. The method of forming the microelectronic interconnect element as claimed in claim 2, wherein the first pitch is equal to at least twice a width of one of the plurality of first metal lines, and second pitch is equal to at least twice a width of one of the plurality of second metal lines, such that, in a direction of the widths of the plurality of first metal lines, edges of at least some of the plurality of first metal lines are insulated and spaced from edges of at least some of the plurality of second metal lines by less than the width of one of the plurality of first metal lines.

4. The method of forming the microelectronic interconnect element as claimed in claim 3, wherein the edges of the at least some of the plurality of first metal lines are insulated and spaced from the edges of the at least some of the plurality of second metal lines by less than 10% of the width of one of the plurality of first metal lines.

5. The method of forming the microelectronic interconnect element as claimed in claim 3, wherein the widths of the plurality of first metal lines and plurality of second metal lines are less than about 60 microns.

6. The method of forming the microelectronic interconnect element as claimed in claim 3, wherein the widths of the plurality of first metal lines and plurality of second metal lines are at most about 20 microns.

7. The method of forming the microelectronic interconnect element as claimed in claim 3, wherein the widths of the plurality of first metal lines and plurality of second metal lines are uniform and are at most about 10 microns.

8. The method of forming the microelectronic interconnect element as claimed in claim 1, wherein each of the plurality of first metal lines has edges extending between upper and lower surfaces of such first metal line and a width between the edges, and each of the plurality of second metal lines has edges extending between upper and lower surfaces of such second metal line and a width between the edges, and a spacing between the edge of one of the plurality of first metal lines and an adjacent edge of one of the plurality of second metal lines is smaller than the widths of the adjacent ones of the pluralities of first and second metal lines.

9. The method of forming the microelectronic interconnect element as claimed in claim 1, wherein the dielectric layer is formed by pressing a dielectric material onto the first plurality of metal lines, such that portions of the dielectric layer separate the plurality of first metal lines from one another.

* * * * *